United States Patent
Beer et al.

(10) Patent No.: US 9,859,251 B2
(45) Date of Patent: Jan. 2, 2018

(54) SEMICONDUCTOR DEVICE HAVING A CHIP UNDER PACKAGE

(71) Applicant: Infineon Technologies AG, Neubiberg (DE)

(72) Inventors: Gottfried Beer, Nittendorf (DE); Peter Ossimitz, Munich (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/012,086

(22) Filed: Feb. 1, 2016

(65) Prior Publication Data
US 2016/0225745 A1 Aug. 4, 2016

(30) Foreign Application Priority Data
Feb. 2, 2015 (DE) .................. 10 2015 101 440

(51) Int. Cl.
| | | |
|---|---|---|
| H01L 23/495 | (2006.01) | |
| H01L 25/065 | (2006.01) | |
| H01L 25/00 | (2006.01) | |
| H01L 23/31 | (2006.01) | |

(52) U.S. Cl.
CPC .......... *H01L 25/0657* (2013.01); *H01L 25/50* (2013.01); *H01L 23/3128* (2013.01); *H01L 2224/04105* (2013.01); *H01L 2224/06181* (2013.01); *H01L 2224/12105* (2013.01); *H01L 2224/16227* (2013.01); *H01L 2224/32225* (2013.01); *H01L 2224/73204* (2013.01); *H01L 2224/73253* (2013.01); *H01L 2924/19104* (2013.01)

(58) Field of Classification Search
USPC ............... 257/625, 676, 779–783, 784–785, 257/E27.137, E27.144, E27.161, E23.023, 257/E23.077, E21.122–E21.128, E21.48, 257/E21.512, E21.519, E21.567–E21.57, 257/E21.087–E21.088, E21.6–E21.601, 257/686; 438/118, 406, 455–459, 438/615–617
See application file for complete search history.

(56) References Cited

U.S. PATENT DOCUMENTS

| | | | | |
|---|---|---|---|---|
| 6,534,723 B1* | 3/2003 | Asai | ................... | H01L 23/49811 174/255 |
| 8,609,463 B2* | 12/2013 | Ko | ................... | H01L 23/552 257/686 |
| 2007/0075420 A1* | 4/2007 | Lu | ................... | H01L 21/4871 257/720 |
| 2008/0116589 A1 | 5/2008 | Li et al. | | |

(Continued)

*Primary Examiner* — Tram H Nguyen
(74) *Attorney, Agent, or Firm* — Murphy, Bilak & Homiller, PLLC

(57) ABSTRACT

A semiconductor device package includes an electronic component and an electrical interconnect. The electronic component is attached to the electrical interconnect. The electrical interconnect is configured to electrically couple the electronic component to external terminals of the semiconductor device package. The electrical interconnect has a first main face facing the electronic component and a second main face opposite the first main face. The semiconductor device package further includes a first semiconductor chip facing the second main face of the electrical interconnect.

22 Claims, 3 Drawing Sheets

(56) References Cited

U.S. PATENT DOCUMENTS

| | | | |
|---|---|---|---|
| 2008/0136003 A1* | 6/2008 | Pendse | H01L 21/563 257/686 |
| 2008/0137312 A1* | 6/2008 | Lee | H01L 23/3135 361/735 |
| 2009/0310322 A1* | 12/2009 | Koh | H01L 21/563 361/783 |
| 2010/0102327 A1 | 4/2010 | Standing | |
| 2011/0074028 A1 | 3/2011 | Pendse | |
| 2011/0241197 A1* | 10/2011 | Theuss | B81C 1/00238 257/693 |
| 2012/0032259 A1* | 2/2012 | Ho | H01L 23/481 257/330 |
| 2013/0056871 A1* | 3/2013 | Yu | H01L 23/3114 257/738 |
| 2013/0256912 A1* | 10/2013 | Prueckl | H01L 24/24 257/777 |
| 2014/0151880 A1 | 6/2014 | Kao et al. | |
| 2015/0359098 A1* | 12/2015 | Ock | H01L 25/16 361/782 |

* cited by examiner

SEMICONDUCTOR DEVICE HAVING A CHIP UNDER PACKAGE

PRIORITY CLAIM

This application claims priority to German Patent Application No. 10 2015 101 440.8 filed on 2 Feb. 2015, the content of said application incorporated herein by reference in its entirety.

TECHNICAL FIELD

This invention relates generally to the technique of semiconductor device packaging, and in particular to the technique of packaging multiple electronic components in a package.

BACKGROUND

Semiconductor device manufacturers are constantly striving to increase the performance of their products, while decreasing their cost of manufacture. A cost intensive area in the manufacture of semiconductor device packages is packaging the semiconductor chip and/or other electronic components. Thus, semiconductor device packages providing for high performance and reliability, superior heat dissipation properties and optimum use of space are desirable. Further, packaging methods providing for compact design, high thermal robustness and improved reliability are desirable.

SUMMARY

According to an embodiment of a semiconductor device package, the semiconductor device package comprises an electronic component, an electrical interconnect attached to the electrical interconnect, the electrical interconnect being configured to electrically couple the electronic component to external terminals of the semiconductor device package, the electrical interconnect having a first main face facing the electronic component and a second main face opposite the first main face, and a first semiconductor chip facing the second main face of the electrical interconnect.

According to an embodiment of a semiconductor device assembly, the semiconductor device assembly comprises a semiconductor device package and an application board. The semiconductor device package comprises an electronic component, an electrical interconnect attached to the electrical interconnect, the electrical interconnect being configured to electrically couple the electronic component to external terminals of the semiconductor device package, the electrical interconnect having a first main face facing the electronic component and a second main face opposite the first main face, and a first semiconductor chip facing the second main face of the electrical interconnect. The semiconductor device package is mounted on the application board. A thermally conducting material is disposed between the first semiconductor chip and the application board.

According to an embodiment of a method of assembling a semiconductor device package to an application board, the method comprises: providing a semiconductor device package comprising an electronic component, an electrical interconnect attached to the electrical interconnect, the electrical interconnect being configured to electrically couple the electronic component to external terminals of the semiconductor device package, the electrical interconnect having a first main face facing the electronic component and a second main face opposite the first main face, and a first semiconductor chip facing the second main face of the electrical interconnect; depositing a thermally conducting material on an area of the application board; placing the semiconductor device package over the area on the application board; and electrically and mechanically connecting the semiconductor device package to the application board, wherein the thermally conducting material interconnects the first semiconductor chip to the area of the application board.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

Figure 1:
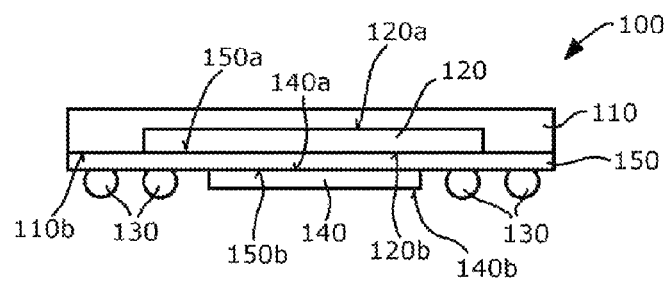
FIG. 1 schematically illustrates a cross-sectional view of an exemplary semiconductor device package including an electronic component, an electrical interconnect and a semiconductor chip under electrical interconnect.

In the following detailed description, reference is made to the accompanying drawings, which form a part thereof, and in which is shown by way of illustration specific embodiments in which the invention may be practiced. In this regard, directional terminology, such as "top", "bottom", "front", "back", "upper", "lower", etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other unless specifically noted otherwise.

Further, as employed in this specification, the terms "bonded", "attached", "connected", "coupled" and/or "electrically connected/electrically coupled" are not meant to mean that the elements or layers must directly be contacted together; intervening elements or layers may be provided between the "bonded", "attached", "connected", "coupled" and/or "electrically connected/electrically coupled" elements, respectively. However, in accordance with the disclosure, the above-mentioned terms may, optionally, also have the specific meaning that the elements or layers are directly contacted together, i.e. that no intervening elements or layers are provided between the "bonded", "attached", "connected", "coupled" and/or "electrically connected/electrically coupled" elements, respectively.

Further, the word "over" used with regard to a part, element or material layer formed or located "over" a surface may be used herein to mean that the part, element or material layer be located (e.g. placed, formed, deposited, etc.) "directly on", e.g. in direct contact with, the implied surface. The word "over" used with regard to a part, element or material layer formed or located "over" a surface may be used herein to mean that the part, element or material layer be located (e.g. placed, formed, deposited, etc.) "indirectly on" the implied surface with one or more additional parts, elements or layers being arranged between the implied surface and the part, element or material layer. The same applies analogously to the terms "under", "below", "beneath", etc.

The semiconductor device packages described herein contain one or more semiconductor chip(s) which are arranged at the bottom side of the semiconductor device package. This or these semiconductor chip(s) may be of different types, may be manufactured by different technologies and may include, for example, integrated circuits, e.g., monolithic integrated electrical, electro-optical or electromechanical circuits. More specifically, the semiconductor chip(s) may include power integrated circuits, logic integrated circuits, analogue integrated circuits, mixed signal integrated circuits, or memory circuits. The semiconductor device packages may also include one or more stacks of semiconductor chips and/or through-encapsulant via(s) and/or passive components. Further, additional devices may be assembled on the top side of the semiconductor device package.

The semiconductor chip(s) referred to above may be manufactured from specific semiconductor material such as, for example, Si, SiC, SiGe, GaAs, GaN, AlGaN, InGaAs, InAlAs, etc., and, furthermore, may contain inorganic and/or organic materials that are not semiconductors.

The semiconductor chip(s) referred to above may include control circuits, microprocessors, memory circuits and/or microelectromechanical components. They may, e.g., include sensors or detectors (such as, e.g., a mechanical force sensor, a pressure sensor, a microphone, an optical sensor/detector) and/or power chips (e.g. power switches, power transistors, etc.).

Semiconductor power chip(s) may, for example, be configured as power MISFETs (Metal Insulator Semiconductor Field Effect Transistors) power MOSFETs (Metal Oxide Semiconductor Field Effect Transistors), IGBTs (Insulated Gate Bipolar Transistors), JFETs (Junction Gate Field Effect Transistors), HEMTs (High Electron Mobility Transistors), power bipolar transistors or power diodes such as, e.g. a PIN diode or a Schottky diode.

The semiconductor chip(s) referred to above may have a vertical structure, that is to say that the semiconductor chip(s) may be fabricated in such a way that electric currents can flow in a direction perpendicular to the main surfaces of the semiconductor chip(s). A semiconductor chip having a vertical structure has electrodes on its two main surfaces, that is to say on its top side and bottom side. By way of example, in vertical devices, the source contact electrode and the gate contact electrode of a power MISFET or a power MOSFET or a HEMT may be situated on one main surface, while the drain contact electrode of the power MISFET or power MOSFET or power HEMT may be arranged on the other main surface. In case of a power diode, the anode contact electrode may be situated on one main surface, while the cathode contact electrode of the power diode may be arranged on the other main surface.

The semiconductor chip(s) referred to above may have a horizontal structure. A semiconductor chip having a horizontal structure often has chip electrodes only on one of its two main surfaces, e.g., on its active surface.

Further, the semiconductor device package described herein contains one or more electronic components. The electronic component(s) may at least partly be embedded in an encapsulant. The electronic component(s) may be designed as passive or active components. In particular, the electronic component(s) may comprise or be a semiconductor chip. By way of example, if designed as a passive component, the electronic component may be a so-called PID (passive integrated device). If designed as an active component, the electronic component may be any of the semiconductor chips as described above in relation to the semiconductor chip arranged at the bottom side of the semiconductor device package. If multiple electronic components are involved, it is possible that at least one active component and at least one passive component are included in the semiconductor device package.

Further, the semiconductor device package described herein contains an electrical interconnect to which the electronic component is attached. The electrical interconnect is configured to electrically couple the electronic component to external terminals of the semiconductor device package. According to one embodiment, the electrical interconnect may be designed as an electrical redistribution structure. An electrical redistribution structure comprises one or more electrical redistribution layers (RDL). Each RDL may be designed as a structured metallization layer. The one or more metallization layers (RDLs) of the electrical redistribution structure may serve as an electrical interconnect configured to electrically connect the electronic component embedded in the encapsulant to the external terminals of the semiconductor device package and/or to one or more electrodes of the semiconductor chip(s) located at the bottom of the semiconductor device package. That is, the semiconductor chip(s) may be disposed, e.g., beneath the bottom side of the electrical interconnect, while the electronic component may, e.g., be disposed over the (opposite) top side of the electrical interconnect.

The electrical redistribution structure may comprise one or more stacked RDLs and one or more insulating polymer layers arranged in alternating order. The one or more RDLs of the electrical redistribution structure may be structured to include conductive traces or conducting lines connected to the electrodes of the semiconductor chip(s) and/or the electrodes of the electronic component and/or the external terminals of the package. The layers of the electrical redistribution structure may be fabricated, e.g., on (artificial) waver level (WL) by thin-film processes.

According to other embodiments the electrical interconnect may be designed as a device carrier of the electronic component. Such device carrier may, e.g., comprise multiple metal plates such as, e.g., one or more electronic component pads and/or terminal pads of, e.g., a leadframe. The electronic component pad(s) may serve as carrier(s), e.g. chip pad(s), and the terminal pads may serve as the external terminals of the semiconductor device package. The metal plates may be made of any metal or metal alloy, e.g. copper or copper alloy. By way of example, such device carrier may be a leadless carrier such as, e.g., a so-called TSLP—(Thin Small Leadless Package—) carrier. The device carrier may also be a leaded carrier having leads protruding out of an encapsulant and forming the external package terminals. By way of example, such leaded device carrier may be a PLCC (Plastic Leaded Chip Carrier), a QFJ—(Quad-Flat-J-Leaded) device carrier or a gull wing device such as, e.g., DSO—(Dual Small Outline) or TQFP—(Thin Quad Flat Package) device carrier, etc. It is also possible that the device carrier may comprise or be a PCB (printed circuit board), a laminate and/or a so-called interposer. In other embodiments, the device carrier (i.e. the electrical interconnect when implemented in the form of a device carrier) may comprise a plate of ceramics coated with a structured metal layer, e.g. a metal bonded ceramics substrate. By way of example, the device carrier may be a DCB (direct copper bonded) ceramics substrate or a silicon interposer.

The semiconductor device package may be fabricated by an eWLP (embedded Wafer Level Packaging) process. In this case, electronic components are placed in a spaced-apart relationship on a temporary packaging carrier. An insulating encapsulation material is then applied over the temporary packaging carrier and over the electronic components placed thereon to form a so-called artificial wafer. The artificial wafer may include a high number of semiconductor device packages. The artificial wafer is then divided into the single semiconductor device packages each being packaged by an encapsulant.

The electronic component(s) may at least partly be surrounded or embedded in at least one encapsulating material forming an encapsulant. The encapsulating material may be an electrically insulating material and may comprise or be a thermoset material or a thermoplastic material. A thermoset material may, e.g., be made on the basis of an epoxy resin, a silicone resin or an acrylic resin. A thermoplastic material may, e.g., comprise one or more materials selected from the group of polyetherimide (PEI), polyether-sulfone (PES), polyphenylene-sulfide (PPS), polyamide-imide (PAI), and polyethylene-terephthalate (PET). Thermoplastic materials melt by application of pressure and heat during molding or lamination and (reversibly) harden upon cooling and pressure release.

The encapsulating material may comprise or be a polymer material, e.g. a duroplastic polymer material. The encapsulating material may comprise or be at least one of a filled or unfilled mold material, a filled or unfilled thermoplastic material, a filled or unfilled thermoset material, a filled or unfilled laminate, a fiber-reinforced laminate, a fiber-reinforced polymer laminate, and a fiber-reinforced polymer laminate with filler particles.

The encapsulating material may be applied over the electronic component(s) by, e.g., molding or laminating.

In the first case, i.e. if the encapsulating material is a mold material, various techniques such as, e.g., compression molding, injection molding, powder molding, liquid molding, or film-assisted molding (FAM) may be used to form an encapsulant or an encapsulation body (e.g. artificial wafer) containing a plurality of encapsulants. The mold material may be applied to overmold the electronic components and, in case a device carrier is used to form the electrical interconnect, the device carrier on which the electronic components are mounted. In case an electrical redistribution structure is used as the electrical interconnect, bottom electrodes of one or more electronic components may, e.g., remain exposed and the electrical redistribution structure is formed on a bottom plane of the artificial wafer after the molding process.

In the second case, i.e. if the encapsulating material is made of a laminate material, the encapsulating material may have the shape of a piece of a layer, e.g. a piece of an electrically insulating foil or sheet that is laminated over the electronic components and, if present, over the package carrier on which the electronic components are mounted. Heat and pressure may be applied for a time suitable to attach the piece of a foil or sheet to the underlying structure. During lamination, the electrically insulating foil or sheet is capable of flowing (i.e. is in a plastic state), resulting in that gaps between the electronic components and/or other topological structures are filled with the polymer material of the electrically insulating foil or sheet. The electrically insulating foil or sheet may comprise or be any appropriate thermoplastic or thermoset material. In various embodiments, the insulating foil or sheet may comprise or be a prepreg (short for pre-impregnated fibers), that is e.g. made of a combination of a fiber mat, for example glass or carbon fibers, and a resin, for example a thermoset or thermoplastic material. Prepreg materials are typically used to manufacture PCBs (printed circuit boards). Again, also for laminate packages, if no device carrier is used, bottom electrodes of one or more electronic component(s) may, e.g., remain exposed and an electrical redistribution structure—such as described before—may be generated on a bottom plane of the artificial wafer after the laminating process to form the electrical interconnect.

A variety of different types of semiconductor devices may be designed in accordance with the disclosure herein. By way of example, a semiconductor device package may constitute a power supply or voltage converter containing a logic integrated circuit as the electronic component and two or more semiconductor power chips, e.g. MISFETs, MOSFETs, or HEMTs, as the one or more semiconductor chips disposed at the bottom of the package. For instance, a semiconductor device package disclosed herein may comprise a half-bridge circuit including a high side transistor, a low side transistor and a logic integrated circuit chip. The logic integrated circuit chip may, optionally, include one or a plurality of transistor driver circuitry.

A half-bridge circuit as disclosed herein may, e.g., be implemented in an electronic circuit for converting DC or AC voltages into DC voltages, so-called DC-DC converters and AC-DC converters, respectively. DC-DC converters may be used to convert a DC input voltage provided by a battery or rechargeable battery into a DC output voltage matched to the demands of electronic circuits connected downstream. By way of example, a DC-DC converter described herein may be a buck converter or down-converter. AC-DC converters may be used to convert an AC input voltage provided by, e.g., a high voltage AC power network into a DC output voltage matched to the demands of electronic circuits connected downstream.

An example of a semiconductor device package 100 is shown in FIG. 1. The semiconductor device package 100 may comprise an encapsulant 110 in which an electronic component 120 is, at least partly, embedded. As described above, the encapsulant 110 may, e.g., either be a mold material or a laminate.

The semiconductor device package 110 further comprises an electrical interconnect 150, external terminals 130 of the semiconductor device package 100 and a (first) semiconductor chip 140. More specifically, the electrical interconnect 150 may have a first (top) main face 150a and a second (bottom) main face 150b opposite to the first main face 150a, with the first main face 150a facing the electronic component 120 and the second main face 150b facing the semiconductor chip 140. Each of the main faces 150a, 150b may, e.g., be plane. The electrical interconnect 150 may electrically interconnect the electronic component 120 to the external terminals 130 and/or the semiconductor chip 140. As mentioned above, the electrical interconnect 150 may, e.g., be a (rigid, prefabricated) device carrier such as, e.g., a leadframe, a laminate, a glass interposer, a silicon interposer, a LTCC (Low Temperature Cofired Ceramic) carrier, a HTC (High Temperature Cofired Ceramic) carrier, an AlN carrier, a PCB, a DCB, etc., or a layer-by-layer built-up electrical redistribution structure comprising one or more RDLs.

As illustrated in FIG. 1, a top surface 120a and side surfaces of the electronic component 120 may be completely embedded in the encapsulant 110. A bottom surface 120b of the electronic component 120 may level with a bottom surface 110b of the encapsulant 110, i.e. the bottom surfaces 120b and 110b may be in the same plane.

The electronic component 120 may be, e.g., any semiconductor device (based on, e.g., Si, SiC, GaN, SiGe), any passive device (e.g. inductor, resistor, capacitor, clock), any MEMS-device (e.g. accelerator-, g-sensor, p-sensor, SAW-device (Surface Acoustic Wave), BAW (Bulk Acoustic Wave)), a packaged device (e.g. VQFN, TSLP, an embedded device), a chip stack, a vertical contact element etc. The number of electronic components 120 may be one or more than one. On the topside of the semiconductor device package 100, e.g. on the top side of the encapsulant 110, additional components (not shown in the FIG. 1) might be placed.

The external terminals 130 of the semiconductor device package 100 may be implemented by solder bumps which are attached to the electrical interconnect 150, e.g. an electrical redistribution structure. Although not shown the external terminals 130 may also be realized by leads or pads of the electrical interconnect 150, in particular, if the electrical interconnect 150 is implemented by a device carrier (that is no electrical redistribution structure).

The semiconductor device package 100 may be implemented as a ball grid array (BGA) package 100. In particular, the semiconductor device package 100 may be an electronic component embedded ball grid array (eBGA) package.

The (first) semiconductor chip 140 may, e.g., be flip-chip bonded to the electrical interconnect 150. In this case, the semiconductor chip 140 may be referred to as a "flip-chip under package" (FUP). The semiconductor chip 140 may have a first main face 140a (which is the bottom face of a FUP) facing the electrical interconnect 150 and a second main face 140b (which is the top face of a FUP) facing towards an application board (not shown) onto which the semiconductor device package 100 is to be mounted.

Thus, the semiconductor chip 140 uses the space under the electrical interconnect 150, i.e. is disposed within the space between the application board (not shown) and the electrical interconnect 150. Thus, the semiconductor chip 140 may exploit the capability of the electrical interconnect 150 to provide electrical connection both at its first main face 150a and its second main face 150b. As the external terminals 130 (e.g. ball grid array) may not be distributed over the entire footprint of the semiconductor device package 100, the semiconductor chip 140 may be positioned in a footprint zone which is free of external terminals 130.

Further, the semiconductor chip 140 may be void of any encapsulant 110. As illustrated in FIG. 1, most of or the entire encapsulant may be located above the electrical interconnect 150, while the semiconductor chip 140 may be located beneath the electrical interconnect 150. In other words, any horizontal plane running through the semiconductor device package 100 may, at the most, intersect one of the semiconductor chip 140 and the encapsulant 110, but not both.

The semiconductor chip 140 may be provided with a metal layer (not shown) extending over at least a part of the second main face 140b of the first semiconductor chip 140. As will be explained in more detail below, this metal layer may provide for low thermal resistance transition when heat is transported from the semiconductor chip 140 and/or the electronic component 120 via a thermal link (not shown) to the application board (not shown) on which the semiconductor device package 100 is to be mounted. Simultaneously, this metal layer, if present, may provide for a semiconductor chip electrode configured to be electrically connected to the application board (not shown) via the thermal link (not shown), which, in this case, also serves as an electrical connection to the application board. In other words, a metal layer (not shown) provided on the second main face 140b of the semiconductor chip 140 may optionally form another external terminal of the semiconductor device package 100.

Figure 2:
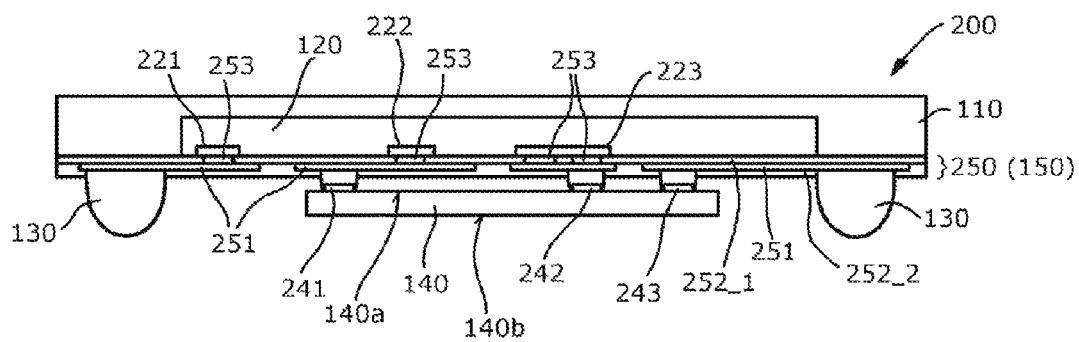
FIG. 2 schematically illustrates a cross-sectional view of an exemplary semiconductor device package including an electronic component, an electrical interconnect and a semiconductor chip under electrical interconnect.

FIG. 2 illustrates an example of a semiconductor device package 200. The semiconductor device package 200 may be understood to be a more specific example of the semiconductor device package 100, and all features explained above in conjunction with FIG. 1 may equally apply to semiconductor device package 200 unless stated otherwise, and vice versa.

In semiconductor device package 200 the electrical interconnect 150 is formed, e.g., by an electrical redistribution structure 250. The electrical redistribution structure 250 may, e.g., include one or more metallization layer(s) 251 and/or one or more dielectric (or insulating) layer(s) 252_1, 252_2.

The metallization layer 251 may include or be of a metal material such as, e.g., copper or aluminum. The metallization layer 251 may be configured for ground, current and/or signal redistribution. That is, chip electrodes 241, 242, 243 of the semiconductor chip 140 may be connected to conductive traces of the metallization layer 251. The conductive traces of the metallization layer 251 may, e.g., be configured to route to one or more external terminals 130 (e.g. solder deposits) of the semiconductor device package 200. Further, some of the conductive traces of the metallization layer 251 may be used as an internal interconnect, i.e. as an interconnect to the electronic component 120. By way of example, conductive traces of the metallization layer 251 may be interconnected via electrical through-connections 253 running through the (e.g. uppermost) dielectric layer 252_1 to electrodes 221, 222, 223 of the electronic component 120 (which may, e.g., be a passive or active semiconductor chip).

The dielectric (or insulating) layers 252_1, 252_2 of the electrical redistribution structure 250 may include or be of a polymer material (e.g. polyimide, epoxy, silicone, etc.). The (lowermost) dielectric layer 252_2 may, e.g., be a solder-stop layer having openings for the solder deposits 130 configured to connect to the application board (not shown). If a plurality of metallization layers 251 (RDLs) is included in the electrical redistribution structure 250, the metallization layers 251 may be separated from one another by dielectric (or insulating) layers 252_1, 252_2. The metallization layer 251 may have a thickness of equal to or greater or less than 15 µm, 10 µm, 5 µm, 2 µm. The dielectric (or insulating) layers 252_1, 252_2 may have a thickness of equal to or greater or less than 15 µm, 10 µm, 5 µm, 2 µm.

As illustrated in FIG. 2, the electrical redistribution structure 250 may, e.g. extend over the entire bottom surface of the semiconductor device package 200. It is possible that the side faces of the semiconductor device package 200 are formed by the encapsulant 110 and by edge faces of the electrical redistribution structure 250. Further, as illustrated in FIG. 2, the semiconductor device package 200 may be a fan-out package, that is a ball grid array (BGA) package having solder deposits 130 intersecting with or located outside the vertical projection of the periphery of the embedded component 120.

Figure 3:
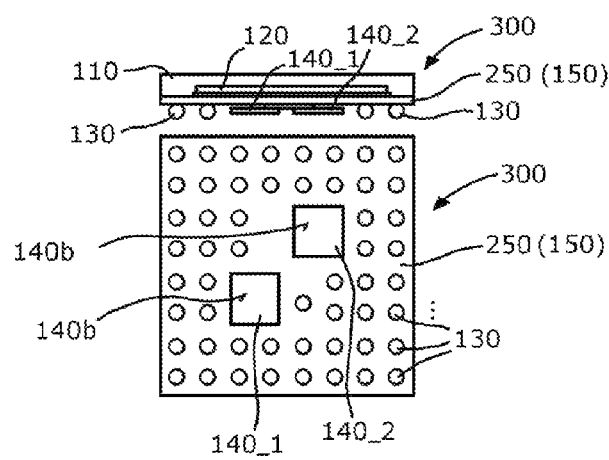
FIG. 3 schematically illustrates a bottom view of an exemplary semiconductor device package including, e.g., two chips under electrical interconnect.

FIG. 3 illustrates a plan view on the bottom surface of a semiconductor device package 300. The semiconductor device package 300 is illustrated in the upper part of FIG. 3 also in a sectional view. The semiconductor device package 300 may be a BGA package. As displayed in FIG. 3, the external terminals 130 (solder deposits) are arranged in a regular pattern at the second main face 150b of the electrical interconnect 150 as, e.g., formed by the electrical redistribution structure 250. The ball grid array may have the shape of a frame enclosing an inner zone of the bottom of the package 300 which is void of solder deposits 130. In the example shown in FIG. 3, this zone is used to accommodate two semiconductor chips 140, i.e. a first semiconductor chip 140_1 and a second semiconductor chip 140_2. Both semiconductor chips 140_1, 140_2 correspond to the semiconductor chip 140 described above, and reference is made to the above disclosure in order to avoid reiteration. Again, the first and second semiconductor chips 140_1 and 140_2 may be configured to be electrically connected to an application board (not shown) and may thus be equipped with a metal layer at their second main face 140b facing the application board.

Although the semiconductor device package 300 is exemplified as a leadless BGA package, it could also be realized as a leaded package and/or in all of the implementations and with all of the features as described above for packages 100, 200. Thus, reference is made to the above description in order to avoid reiteration.

Figure 4:
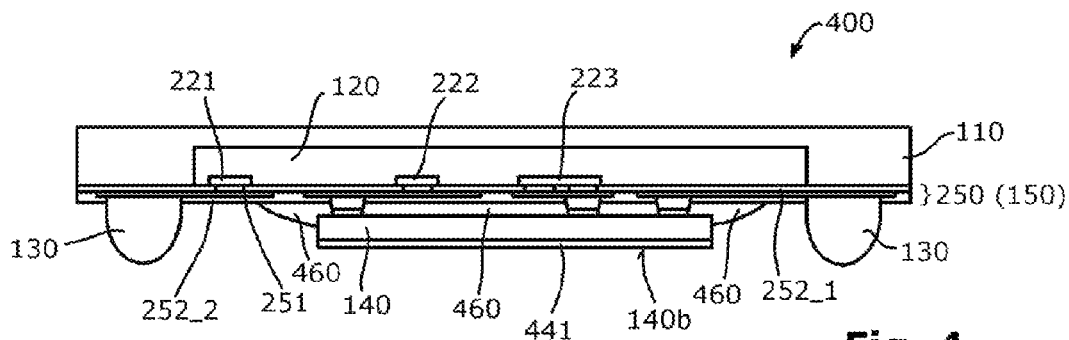
FIG. 4 schematically illustrates a cross-sectional view of an exemplary semiconductor device package including an electronic component, an electrical interconnect, a semiconductor chip under electrical interconnect and an underfill material between the electrical interconnect and the semiconductor chip.

FIG. 4 illustrates an exemplary semiconductor device package 400. Semiconductor device package 400 is identical or similar to semiconductor device package 200 except that an underfill material 460 is arranged between the electrical interconnect 150 (e.g. electrical redistribution structure 250) and the semiconductor chip 140. The underfill material 460 may completely fill the space between the electrical interconnect 150 and the semiconductor chip 140. The underfill material 460 may provide for a protection against environmental attack during, e.g., subsequent processing steps such as, e.g., reflow soldering of the semiconductor device package 400. Further, the underfill material 460 may improve the reliability of the electrical and mechanical connection between the electrical interconnect 150 (e.g. electrical redistribution structure 250) and the semiconductor chip 140.

Further, FIG. 4 illustrates the semiconductor chip 140 to be equipped with a metal layer 441 at its second main face 140b. The metal layer 441 may be an electrode of the semiconductor chip 140 or may simply be a metal layer which is not used for electrically connecting the semiconductor chip 140 to an application board but effectively removing heat from the semiconductor chip 140 to the application board. The metal layer 441 may, e.g., cover equal to or more than 50%, 60%, 70%, 80%, 90%, 95% of the area of the second main face 140b of the semiconductor chip 140.

Figure 5:
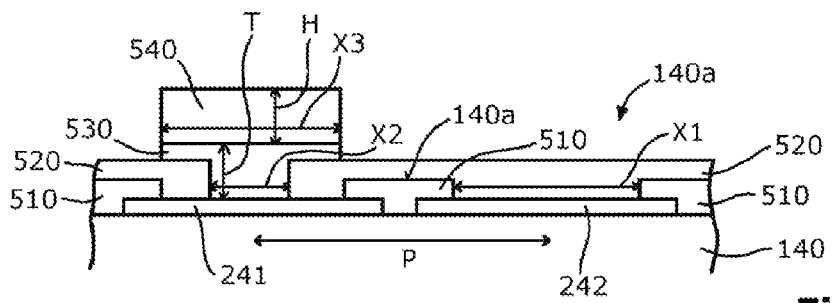
FIG. 5 schematically illustrates an exemplary chip electrode at the semiconductor chip surface facing the electrical interconnect.

FIG. 5 illustrates by way of example chip electrodes 241, 242 and 243 (243 is not shown) arranged at the first main face 140a of the semiconductor chip 140. The chip electrodes 241, 242, 243 may be made of, e.g., aluminum, copper, Ni, Au. The chip electrodes 242, 242, 243 may have a pitch P of about, e.g., 300 µm, 200 µm, 150 µm, 120 µm, 100 µm, 80 µm, 60 µm with tolerances of, e.g., ±2 µm, ±5 µm, ±10 µm, ±20 µm, ±30 µm. The first main face 140a of the semiconductor chip 140 may be provided by a hard passivation layer 510 such as, e.g., an inorganic insulating layer made of, e.g. silicon-oxide, silicon-nitride, etc. The hard passivation layer 510 may have (e.g. disc-shaped, square, etc.) openings of a diameter or lateral dimension X1 of about, e.g., 65 µm corresponding to the pitch of e.g. 120 µm.

A polymer layer 520 may cover the hard passivation layer 510 and the openings therein. The polymer layer 520 may be provided with openings exposing the chip electrodes 241, 242, 243 (here, the opening is only shown for chip electrode 241). The openings may be formed, e.g., cylindrical, octagonal, etc., having a diameter X2 slightly smaller than the lateral dimension X1. The openings of the polymer layer 520 may be filled by metal structures 530. The metal structures 530 may, e.g., have a nominal thickness T of less than or greater than about 4 µm, 8 µm, 15 µm, 25 µm. The metal structures 530 may, e.g., be made of copper, copper alloy, Ni or any metal stack. There might be applied a diffusion barrier of, e.g., Ti, WTi, between the chip electrode 241 metal and the metal structure 530. The metal structures 530 may laterally project over the polymer layer 520 and may have a top side diameter X3 slightly greater than the lateral dimension X1, e.g. of about 2 µm, 5 µm, 10 µm, 20 µm, 50 µm. A solder deposit 540, e.g. made of SAC (SnAgCu) or other solder materials, may be applied to the top of the metal structure 530. The solder deposit 540 may have a nominal height H according to the pitch P and the dimension X3 of, e.g., 5 µm, 10 µm, 20 µm, 30 µm, 50 µm. The electrical interconnect 150 of the semiconductor device package 400 is prepared to be solderable (e.g. any solder/solder alloy, NiAu-pad finish, NiPdAu pad finish, Ag-finish, OSP-finish (Organic Surface Protection)) with the solder deposit 540. For any skilled person it is obviously that the relevant metallization may be applied onto the semiconductor chip 140 or onto the electrical interconnect 150 or both.

The semiconductor chip 140 having a first main face 140*a* as depicted, e.g., in FIG. 5 is then flip-chip bonded to the electrical interconnect 150 by a reflow process. After the reflow process the bump height (i.e. the spacing between the polymer layer 520 and the (lowermost) dielectric layer 252_2 of the electrical interconnect 150) may be about 2 µm, 5 µm, 10 µm, 20 µm, 50 µm. Thus, in FIG. 4, this bump height defines the space to be filled with the underfill material 460.

Figure 6:
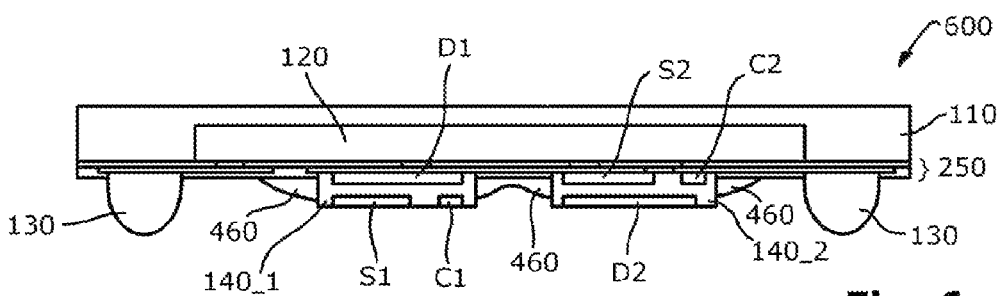
FIG. 6 schematically illustrates a cross-sectional view of an exemplary semiconductor device package designed as a half-bridge semiconductor device package such as, e.g., a voltage converter.

As already mentioned and exemplarily shown in FIG. 3, a first and a second semiconductor chip 140_1, 140_2 may be bonded, e.g. flip-chip bonded, to the electrical interconnect 150. FIG. 6 illustrates a specific example of a semiconductor device package 600 equipped with a first semiconductor chip 140_1 and a second semiconductor chip 140_2. The semiconductor device package 600 may be designed to incorporate a half-bridge structure. The first semiconductor chip 140_1 may have a first load electrode (e.g. source electrode S1), a control electrode (e.g. gate electrode) C1 and a second load electrode (e.g. drain electrode D1) and the second semiconductor chip 140_2 may have a first load electrode (e.g. source electrode S2), a control electrode (e.g. gate electrode) C2 and a second load electrode (e.g. drain electrode D2). The second load electrode of the first semiconductor chip 140_1 (e.g. drain electrode D1), the first load electrode of the second semiconductor chip 140_2 (e.g. source electrode S2) and the control electrode C2 may be electrically connected to the electrical interconnect 150, e.g. electrical redistribution structure 250. The first load electrode of the first semiconductor chip 140_1 (e.g. source electrode S1), the control electrode C1 and the second load electrode of second semiconductor chip 140_2 (e.g. drain electrode D2) may face away from the semiconductor device package 600 and may be configured to be electrically connected to an application board (not shown).

Generally, when two or more semiconductor chips 140_1, 140_2 are provided at the bottom of the device package, the first semiconductor chip 140_1 and the second semiconductor chip 140_2 may be arranged in a laterally spaced relationship or in a stacked relationship. If arranged as a semiconductor chip stack (not shown), the upper first semiconductor chip 140_1 and the lower second semiconductor chip 140_2 may be interconnected by solder bonds arranged between matching chip electrodes of the semiconductor chip 140_1, 140_2.

Figure 7:
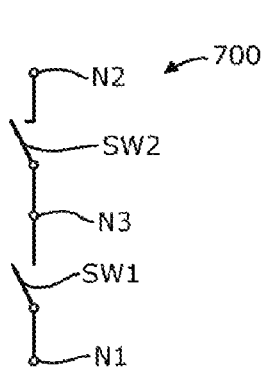
FIG. 7 illustrates a basic circuit diagram of a half-bridge semiconductor device package.

FIG. 7 illustrates a basic circuit 700 of a half-bridge structure as, e.g., implemented in semiconductor device package 600. The half-bridge is arranged between node N1 (e.g. ground) and node N2 (e.g. supply voltage Vdd). The basic circuit 700 comprises two switches SW1 and SW2 connected in series. The first semiconductor chip 140_1 may be implemented as low side switch SW1 and the second semiconductor chip 140_2 may be implemented as high side switch SW2. Then, compared to the semiconductor device package 600 of FIG. 6, the node N1 may be the source electrode S1 of the first semiconductor chip 140_1, the node N2 may be the drain electrode D2 of the second semiconductor chip 140_2 and the node N3 arranged between the two switches SW1 and SW2 may be implemented by the electrical interconnect 150, in particular by one or more metallization layers 251 of the electrical redistribution structure 250. Node N3 may optionally be used for voltage sensing by electronic component 120. By way of example, the high side switch SW2 and/or the low side switch SW1 may be implemented by N-MOSFETs. Both semiconductor chips 140_1, 140_2 may, e.g., be power chips.

Voltages applied between node N1 and node N2 may be equal to or greater than 3 V, 5 V, 12 V, 30 V, 50 V, 100 V, 300 V, 500 V, 1000 V. In particular, voltages applied between nodes N1 and N2 may be in a range between, e.g., 3-30 V if the semiconductor device package 600 incorporates or is a DC-DC converter. Further, if the semiconductor device package 600 is an AC-DC converter, the voltages applied between nodes N1 and N2 may, e.g., be in a range between 20-300 V.

Figure 8:
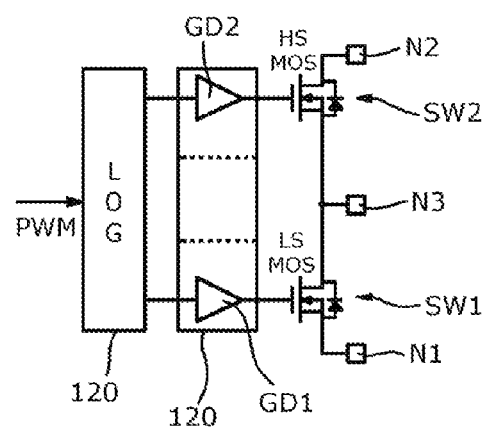
FIG. 8 illustrates a basic circuit diagram of a half-bridge semiconductor device package including logic circuitry and driver circuitry.

FIG. 8 is an exemplary, more detailed illustration of the circuitry 700 shown in FIG. 7 and applicable to the semiconductor device packages 100-400, 600 as described herein. The low side (LS) switch SW1 may be implemented by a LS MOSFET and the high side (HS) switch SW2 may be implemented by a HS MOSFET. The gate (control electrode C1) of the LS MOSFET is driven by gate driver GD1 and the gate (control electrode C2) of the HS MOSFET is driven by gate driver GD2. Gate drivers D1 and D2 are controlled by logic LOG. The logic LOG may receive, e.g., an external PWM (pulse-width modulated) signal.

By way of example, the logic LOG may be implemented in one electronic component 120 and the gate drivers GD1, GD2 may be implemented in another electronic component 120. In this case, two electronic components 120 (e.g. semiconductor chips) may be embedded in the semiconductor device package 100, 600. In other embodiments the DC-DC converter elements (HS, LS, driver, control units) are integrated in the semiconductor chip 140 and are supplying the electronic component 120 (e.g. micro controller, embedded in the encapsulant 110) with the relevant voltage(s). Further, it is also possible that the gate drivers GD1 and GD2 and the logic LOG are implemented in one single electronic component, e.g. one single semiconductor chip, which may be placed either side by side to an electronic component 120 embedded in an encapsulant 110 or side by side to the semiconductor chip(s) 140.

It is to be noted that the design of a down source electrode S1, a down gate electrode C1 and down drain electrode D2 (see, e.g., FIG. 6) allows low inductive and resistive parasitics and a highly efficient heat dissipation to the application board (not shown). Further, a low $R_{DS(on)}$ (drain-source on state resistance) may be achieved since the electrical connections on the application board may be short. The temperature cycling on board (TCoB) reliability may be optimized by placing the first and second semiconductor power chips 140_1 and 140_2 in a central region of the package near to the package center (also referred to as the "neutral point").

In all implementations described herein, the semiconductor device package 100-400, 600 may be configured to be mounted on an application board with a thermally conducting material disposed between and connecting to the semiconductor chip(s) 140, 140_1, 140_2 and the application board.

The thermally conducting material may be an electrically conducting material, in particular a solder material or an electrically conducting adhesive. By way of example, the thermally conducting material may, e.g., be a solder material such as, e.g., AuSn, SAC, AgSn, CuSn, AgIn, AuIn, SnIn, CuIn, AuSi, Sn, or Au, or an electrically conducting paste containing metal particles distributed in a polymer material or low temperature sintering paste (so-called nanopaste).

Further, the thermally conducting material may be an electrically insulating material (this may, in particular, be the case when the metal layer 441 does not form a chip electrode or when no metal layer 441 is provided on the semiconductor chip 140). The electrically insulating material may, in particular, be a polymer material filled with ceramic particles.

Figure 9:
FIG. 9 schematically illustrates a cross-sectional view of an exemplary application board on which a semiconductor device package is to be mounted.

FIG. 9 illustrates an application board 900, e.g. motherboard, on which the semiconductor device package 100-400, 600 is to be mounted. The application board 900 may, e.g., be a PCB or another type of application board, e.g. a ceramic substrate, etc. The application board 900 may comprise an insulating board substrate 910 such as, e.g., a fiber-reinforced insulating polymer plate. The application board 900 may further comprise one or more metal layers wherein at least the uppermost metal layer is structured into conductive traces or lands 920. The application board 900 may further comprise a top insulating layer 930 exposing the conductive traces or lands 920. The application board 900 may further comprise electrical and/or thermal vias used to interconnect two or more metal layers in a vertical direction through at least a part of the board substrate 910. Neither electrical and/or thermal vias nor multiple metal layers are depicted in FIG. 9 for the sake of simplicity. In case of no electrical connection of the second main surface(s) 140b of the semiconductor chips(s) 140 to the application board 900 this area might be used for placing vias (not shown in the Figures) in the application board 900 thereby enabling a higher degree of routing capability of application board 900.

Figure 10A:
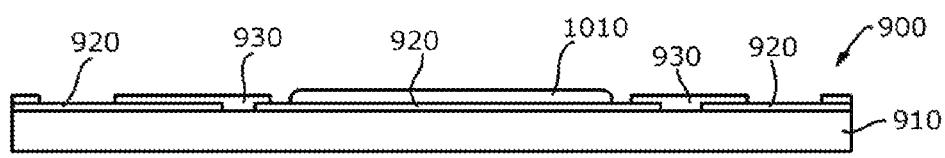
FIGS. 10A and 10B schematically illustrate cross-sectional views of exemplary application boards with a thermally conducting material disposed on an area of each application board on which the semiconductor device package is to be mounted.
Figure 10B:
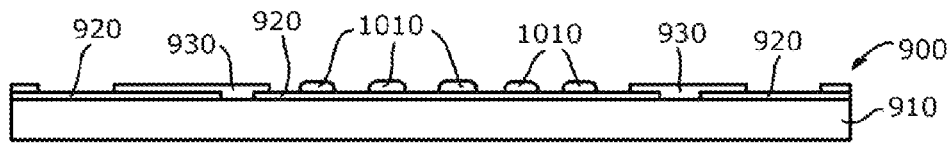

FIGS. 10A and 10B illustrate that a thermally conducting material 1010 is applied to exposed conductive traces or lands 920 of the application board 900. The thermally conducting material 1010 may either be applied over an area of the application board 900 as a continuous layer as shown in FIG. 10A or in an array pattern as shown in FIG. 10B. The thermally conducting material 1010 may optionally also be applied over exposed areas of the conductive traces or lands 920 which are configured to form bonding pads on the application board 900 for the external terminals 130.

The thermally conducting material 1010 may be applied by various techniques. The thermally conducting material 1010 may be deposited on the application board 900 by screen or stencil printing. By way of further examples the thermally conducting material 1010 may be deposited on the application board 900 or on the second main face 140b of the semiconductor chip 140 (not shown) by printing, dispensing, a plasma beam process, galvanic or electroless deposition, etc.

Figure 11:
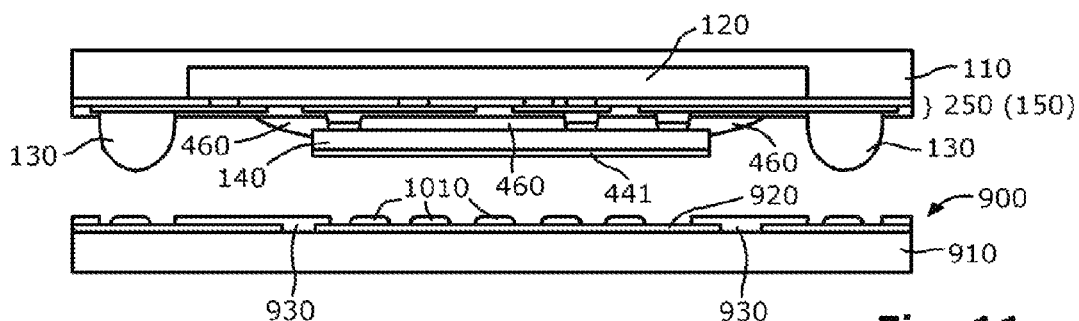
FIG. 11 schematically illustrates a cross-sectional view of an exemplary application board and an exemplary semiconductor device package aligned to the application board.

Referring to FIG. 11, the semiconductor device package 100-400, 600 may then be aligned over the application board 900. In a subsequent step the semiconductor device package 100-400, 600 may be placed down on the application board 900 and mounted to the application board 900 by, e.g., a SMD (Surface Mountable Device) mounting process. The mounting process provides for thermally connecting the first semiconductor chip 140 via the thermally conducting material 1010 to the application board 900.

The mounting process may, e.g., be a reflow process, a sinter process or a curing process. The mounting process may be performed by the application of heat. If a reflow process is used, the solder deposits (external terminals 130) of the semiconductor device package 100-400, 600 and the thermally conducting material 1010 (which may also be a solder material) may concurrently be melted and bonded to the application board 900.

It is also possible that an electrically insulating thermally conducting material 1010 is used and that a reflow process solders the external terminals 130 (e.g. solder deposits) to the application board 900 while the thermally conducting material 1010 is interconnected to the application board 900 and the first semiconductor chip by, e.g., a curing process. If the thermally conducting material 1010 is electrically insulating, electrical vias and conducting traces for routing signals may (also) be provided in the application board 900 in the area under the thermally conducting material 1010. This may improve the signal routing capacity of the application board 900.

Figure 12:
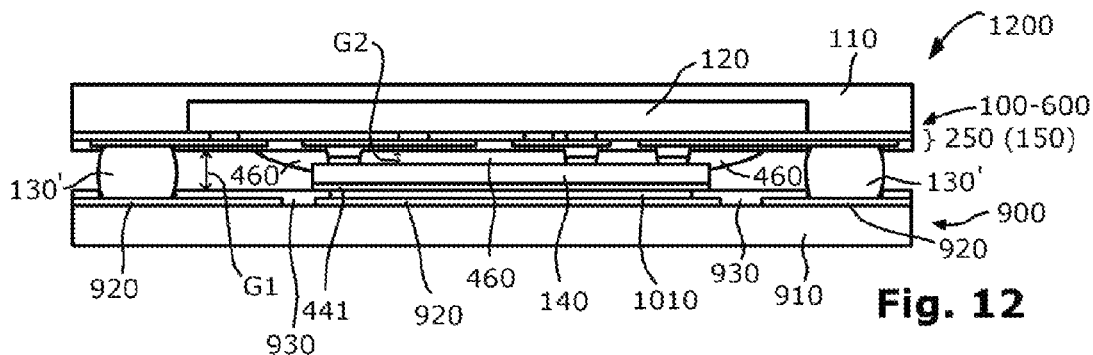
FIG. 12 schematically illustrates a cross-sectional view of an assembly comprising an exemplary application board and an exemplary semiconductor device package mounted thereon.

FIG. 12 illustrates a semiconductor device assembly 1200 comprising a semiconductor device package 100-400, 600 and the application board 900 on which the semiconductor device package 100-400, 600 is mounted. The thermally conducting material 1010 is disposed between and connected to the semiconductor chip 140 and the application board 900. By way of example, if semiconductor power device package 600 is considered, the thermally conducting material 1010 may, e.g., be a solder material applied between S1 and a corresponding conductive trace 920, C1 and a corresponding conductive trace 920 and D2 and a corresponding conductive trace 920, respectively.

By way of example, after the mounting process (e.g. reflow process), the distance G1 between the electrical interconnect 150 (e.g. electrical redistribution structure 250) and the application board 900 may be equal to or greater or less than 100 μm, 120 μm, 140 μm, 160 μm, 180 ρm, 200 μm, 220 μm, 240 μm. The distance G2 between the electrical interconnect 150 and the semiconductor chip 140 may, e.g., be in a range from 15 to 80 μm. The thickness of the thermally conducting material 1010 in the semiconductor device assembly 1200 (i.e. after the mounting process) may, e.g., be equal to or less or greater than 40 μm, 60 μm, 80 μm, 100 μm. Note that after the mounting process, if the external terminals 130 are formed by solder deposits, the solder deposits are collapsed solder bonds 130'.

Although specific embodiments have been illustrated and described herein, it will be appreciated by those of ordinary skill in the art that a variety of alternate and/or equivalent implementations may be substituted for the specific embodiments shown and described without departing from the concept of the present invention. This application is intended to cover any adaptations, variations and combinations of the specific embodiments discussed herein. By way of example, any types and numbers of "under package" semiconductor chips 140, 140_1, 140_2, electronic components 120 as well as thermally conducting materials 1010 for bonding the semiconductor device package 100_400, 600 to the application board 900 may be encompassed by the various embodiments. Therefore, it is intended that this invention be limited only by the claims and the equivalents thereof.

What is claimed is:
1. A semiconductor device package, comprising:
an electronic component;
an electrical interconnect attached to the electronic component, the electrical interconnect having a first main face facing the electronic component and a second main face opposite the first main face;
external terminals disposed at the second main face of the electrical interconnect;
an encapsulant embedding a top surface and side surfaces of the electronic component such that a bottom surface of the electronic component is in a same plane as a bottom surface of the encapsulant and the bottom surface of the encapsulant contacts the first main face of the electrical interconnect; and a first semiconductor chip facing the second main face of the electrical interconnect, wherein the electrical interconnect is configured to electrically couple the electronic component to the external terminals, wherein a height of the external terminals is at least as great as a thickness of the first semiconductor chip so that the first semiconductor chip can be mounted to a planar application board at a side of the first semiconductor chip opposite the electrical interconnect.

2. The semiconductor device package of claim 1, wherein the first semiconductor chip is void of the encapsulant.

3. The semiconductor device package of claim 1, wherein the first semiconductor chip is mounted to the electrical interconnect.

4. The semiconductor device package of claim 1, wherein the electrical interconnect is an electrical redistribution structure.

5. The semiconductor device package of claim 1, wherein the first semiconductor chip is a power semiconductor chip.

6. The semiconductor device package of claim 1, wherein the first semiconductor chip is a vertical device having at least a first chip electrode at a first main face of the first semiconductor chip facing the electrical interconnect and having at least a second electrode at a second main face opposite the first main face.

7. The semiconductor device package of claim 1, further comprising:
an underfill material arranged between the electrical interconnect and the first semiconductor chip.

8. The semiconductor device package of claim 1, further comprising:
a second semiconductor chip facing the second main face of the electrical interconnect.

9. The semiconductor device package of claim 8, wherein the first semiconductor chip and the second semiconductor chip are arranged in a laterally spaced relationship or in a stacked relationship.

10. The semiconductor device package of claim 1, wherein the electrical interconnect is configured to electrically connect the first semiconductor chip to the external terminals of the semiconductor device package.

11. The semiconductor device package of claim 1, wherein the electrical interconnect is configured to electrically connect the first semiconductor chip to the electronic component.

12. The semiconductor device package of claim 1, wherein the electronic component is a semiconductor chip which comprises one of a logic circuit, a driver circuit, a power circuit and an integrated passive device.

13. The semiconductor device package of one claim 1, wherein the semiconductor device comprises a voltage converter.

14. A semiconductor device assembly, comprising:
a semiconductor device package comprising:
an electronic component;
an electrical interconnect attached to the electronic component, the electrical interconnect having a first main face facing the electronic component and a second main face opposite the first main face;
external terminals disposed at the second main face of the electrical interconnect;
an encapsulant embedding a top surface and side surfaces of the electronic component such that a bottom surface of the electronic component is in a same plane as a bottom surface of the encapsulant and the bottom surface of the encapsulant contacts the first main face of the electrical interconnect; and
a first semiconductor chip facing the second main face of the electrical interconnect, the electrical interconnect configured to electrically couple the electronic component to the external terminals;
a planar application board on which the semiconductor device package is mounted; and
a thermally conducting material disposed between the first semiconductor chip and the application board,
wherein a height of the external terminals is at least as great as a thickness of the first semiconductor chip so that the first semiconductor chip is mounted to the planar application board at a side of the first semiconductor chip opposite the electrical interconnect.

15. The semiconductor device assembly of claim 14, wherein the thermally conducting material is electrically conducting.

16. The semiconductor device assembly of claim 15, wherein the thermally conducting material is a solder material or an electrically conducting adhesive.

17. The semiconductor device assembly of claim 14, wherein the thermally conducting material is electrically insulating.

18. The semiconductor device assembly of claim 17, wherein the thermally conducting material is a polymer material filled with ceramic particles.

19. The semiconductor device assembly of claim 14, wherein the application board comprises electrically conducting vias in an area beneath the first semiconductor chip.

20. A method of assembling a semiconductor device package to a planar application board, the method comprising:
providing a semiconductor device package comprising an electronic component, an electrical interconnect attached to the electronic component, the electrical interconnect having a first main face facing the electronic component and a second main face opposite the first main face, external terminals disposed at the second main face of the electrical interconnect, and a first semiconductor chip facing the second main face of the electrical interconnect, the electrical interconnect configured to electrically couple the electronic component to the external terminals,
wherein an encapsulant is applied to a top surface and side surfaces of the electronic component prior to attaching the electrical interconnect to the electronic component such that bottom electrodes of the electronic component facing the first main face of the electrical interconnect remain exposed after application of the encapsulant;
depositing a thermally conducting material on an area of the planar application board;
placing the semiconductor device package over the area on the application board; and
electrically and mechanically connecting the semiconductor device package to the application board, wherein the thermally conducting material interconnects the first semiconductor chip to the area of the application board, wherein a height of the external terminals is at least as great as a thickness of the first semiconductor chip so that the first semiconductor chip is mounted to the planar application board at a side of the first semiconductor chip opposite the electrical interconnect.

21. The method of claim 20, wherein:
the thermally conducting material is a solder material; and
electrically and mechanically connecting the semiconductor device package to the application board comprises soldering the first semiconductor chip to the area of the application board via the solder material.

22. The semiconductor device package of claim 1, wherein chip pads located on the bottom surface of the electronic component attach to corresponding through-connections located on the first main face of the electrical interconnect, wherein the electrical interconnect is a device carrier of the electronic component.

* * * * *